(12) United States Patent
Furuyama et al.

(10) Patent No.: US 8,290,326 B2
(45) Date of Patent: Oct. 16, 2012

(54) FLEXIBLE WIRING BOARD, MANUFACTURING METHOD THEREOF AND FLEXIBLE WIRING DEVICE

(75) Inventors: Hideto Furuyama, Yokohama (JP);
Hiroshi Uemura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 374 days.

(21) Appl. No.: 12/644,723

(22) Filed: Dec. 22, 2009

(65) Prior Publication Data

US 2011/0064369 A1 Mar. 17, 2011

(30) Foreign Application Priority Data

Sep. 15, 2009 (JP) .................... 2009-213622

(51) Int. Cl.
*G02B 6/10* (2006.01)
(52) U.S. Cl. ........... 385/129; 385/14; 385/130; 385/147
(58) Field of Classification Search .................. 385/129, 385/130, 147, 14
See application file for complete search history.

(56) References Cited

U.S. PATENT DOCUMENTS

| | | | |
|---|---|---|---|
| 7,267,552 B2 * | 9/2007 | Lin et al. ................ | 439/67 |
| 7,664,352 B1 * | 2/2010 | Okayama ................ | 385/43 |
| 2006/0192278 A1 | 8/2006 | Furuyama et al. | |
| 2008/0181561 A1 | 7/2008 | Furuyama | |
| 2009/0067779 A1 | 3/2009 | Furuyama | |
| 2011/0067903 A1 | 3/2011 | Lin et al. | |

FOREIGN PATENT DOCUMENTS

| | | |
|---|---|---|
| JP | 56-51378 | 5/1981 |
| JP | 07-288041 | 10/1995 |
| JP | 2001053393 | 2/2001 |
| JP | 3098782 | 10/2003 |
| JP | 2007043129 | 2/2007 |
| JP | 2007-073924 | 3/2007 |
| JP | 2008159766 | 7/2008 |

OTHER PUBLICATIONS

Japanese Office Action for Japanese Application No. 2009-213622 mailed on Nov. 15, 2011.

* cited by examiner

*Primary Examiner* — Jennifer Doan
(74) *Attorney, Agent, or Firm* — Turocy & Watson, LLP

(57) ABSTRACT

A flexible wiring board including a pair of end regions provided in portions of a flexible wiring board on which a plurality of wires are arranged in parallel in one direction and disposed separately in a wiring lengthwise direction, a wiring region configured in another portion of the wiring board and sandwiched between the end regions, a plurality of flexible wiring fins which is divided by at least one slit that connects the end regions in the wiring region, and a flexible wiring bundle by bundling at least part of the plurality of flexible wiring fins.

18 Claims, 11 Drawing Sheets

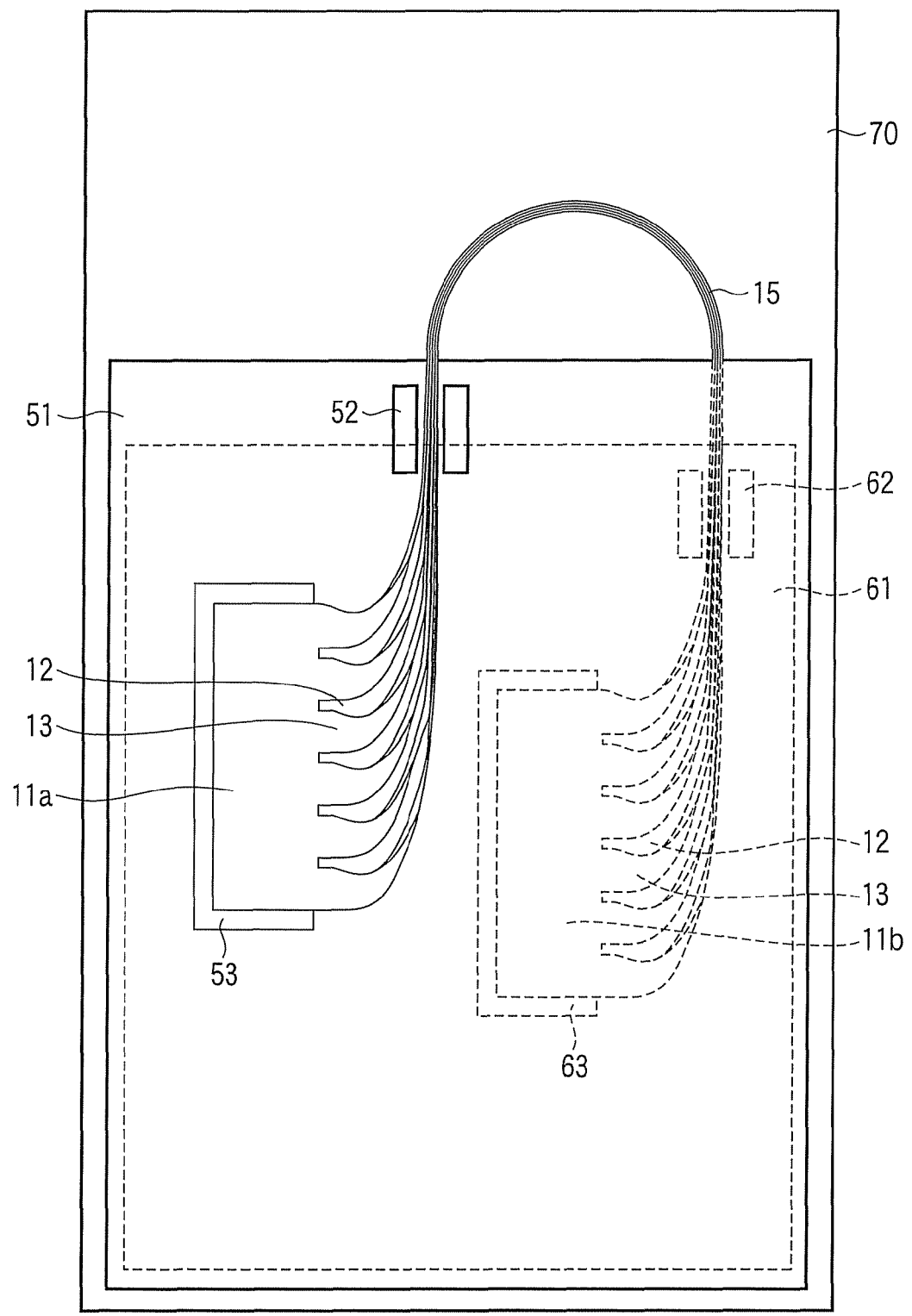
F I G. 11

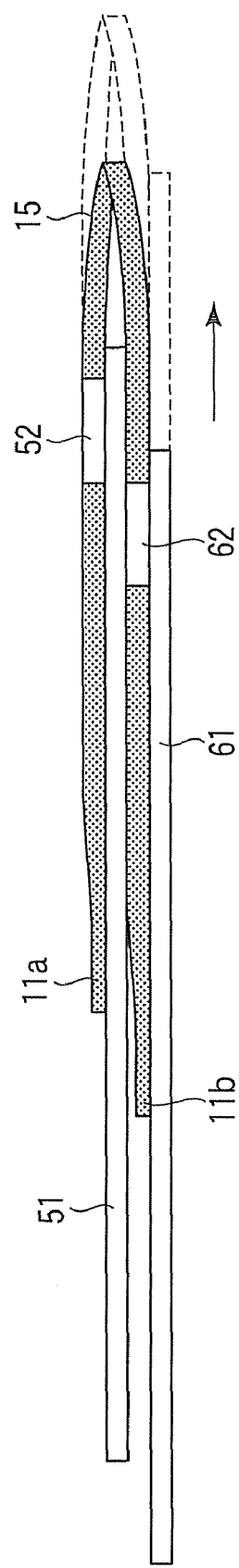
F I G. 13

FLEXIBLE WIRING BOARD, MANUFACTURING METHOD THEREOF AND FLEXIBLE WIRING DEVICE

CROSS-REFERENCE TO RELATED APPLICATIONS

This application is based upon and claims the benefit of priority from prior Japanese Patent Application No. 2009-213622, filed Sep. 15, 2009, the entire contents of which are incorporated herein by reference.

BACKGROUND

As wires arranged on curved surface portions or mechanically movable portions of electronic devices, flexible wiring boards having flexibility are used (for example, JP-A 2007-43129 (KOKAI)). Further, the operation speeds of large-scale integrated circuits (LSIs) are dramatically enhanced according to enhancement in the performances of electronic devices such as bipolar transistors and field-effect transistors. Therefore, there occurs a problem that an erroneous operation due to electromagnetic noise and the speed limitation in the electrical wirings used to connect them will occur. A flexible wiring board in which a high-speed signal is distributed by use of light is proposed (for example, JP-A 2008-159766 (KOKAI)).

SUMMARY

According to one aspect of this invention, there is provided a flexible wiring board comprising a pair of end regions provided in portions of a flexible wiring board on which a plurality of wires are arranged in parallel in one direction and disposed separately in a wiring lengthwise direction, a wiring region configured in another portion of the wiring board and sandwiched between the end regions, a plurality of flexible wiring fins which is divided by at least one slit that connects the end regions in the wiring region, and a flexible wiring bundle bundling at least part of the plurality of flexible wiring fins.

According to another aspect of this invention, there is provided a manufacturing method of a flexible wiring board comprising forming a plurality of flexible wiring fins by dividing a wiring region by forming at least one slit in a wiring lengthwise direction in the wiring region sandwiched between end regions at two ends in the wiring lengthwise direction of a flexible wiring board on which a plurality of wires are arranged in parallel in one direction, rotating the end regions in an in-plane direction to twist and attract the flexible wiring fins and superimpose the wiring fins with front and back surfaces of the adjacent wiring fins set in opposition to each other, and bundling the superimposed portion of the flexible wiring fins with a binding band.

According to another aspect of this invention, there is provided a flexible wiring device comprising a first board comprising a first wire connection portion, a second board comprising a second wire connection portion, and a flexible wiring board connected between the first and second wire connection portions, wherein the flexible wiring board comprises a pair of end regions and a wiring region sandwiched between the end regions, the wiring region is divided into a plurality of flexible wiring fins by at least one slit that connects the end regions in the wiring region and a bundled region is formed by partly bundling the plurality of flexible wiring fins with one of a guide mechanism and bundling member provided on each board.

BRIEF DESCRIPTION OF THE DRAWING

FIG. 11 is a schematic top view showing a flexible wiring board according to an eighth embodiment.
FIG. 13 is a schematic side view showing the flexible wiring board according to the eighth embodiment.

DETAILED DESCRIPTION

Embodiments of this invention will be explained with reference to the accompanying drawings. In this case, the explanation is made by taking a case wherein concrete materials and configurations are used as an example. Materials and configurations having similar functions can be similarly used and this invention is not limited to the following embodiments.

For example, as a wiring board having flexibility, a flexible printed circuit (FPC) and flexible flat cable (FFC) are provided and this invention can be applied to either type of wiring board. Further, in this example, an FPC using polyimide for a base film is described as an example, but it is possible to use liquid crystal polymer or other resin for the base film instead of plyimide. It is further possible to form the electrical wiring of the FPC or FFC in a single-layered form or multi-layered form and provide optical wiring together with the above wiring as will be described later. In the following embodiments, the board shape of the flexible wiring board may be shown and a wiring pattern of electrical wires may be omitted in some cases. This is done to simplify the explanation and it is of course possible to form desired wiring.

The FPC is a flexible wiring circuit in which electrical wires of Cu foils are formed on a resin film. Further, the FFC is a flexible wiring circuit in which Cu ribbon wires are arranged in parallel and arrayed in a ribbon form by use of resin. However, each of the above flexible wiring circuits has a property that it is difficult to be deformed in an in-plane (horizontal) direction of the film (or ribbon) plane although it is excellent in flexibility in a normal direction of the film (or ribbon) plane.

Therefore, it is considered to use the FPC or FFC by narrowing the film width of the FPC or the ribbon width of the FFC. However, in this case, the number of wiring lines that can be mounted on the flexible wiring board is reduced and it becomes necessary to arrange a plurality of FPCs or FFCs in parallel. As a result, there occurs a problem that the cost thereof rises because the number of members is increased and the mounting process becomes complicated. Further, a problem that the reliability of a device on which connection parts are mounted becomes lower because of an increase in the number of connection parts will also occur. Particularly, the FFC is set in an equivalent state in which arrayed Cu wires are dispersed and is set equal to a state in which Cu wires are simply arranged in parallel and connected together, and thus the reverse state of the original intention occurs.

First Embodiment

Figure 1:
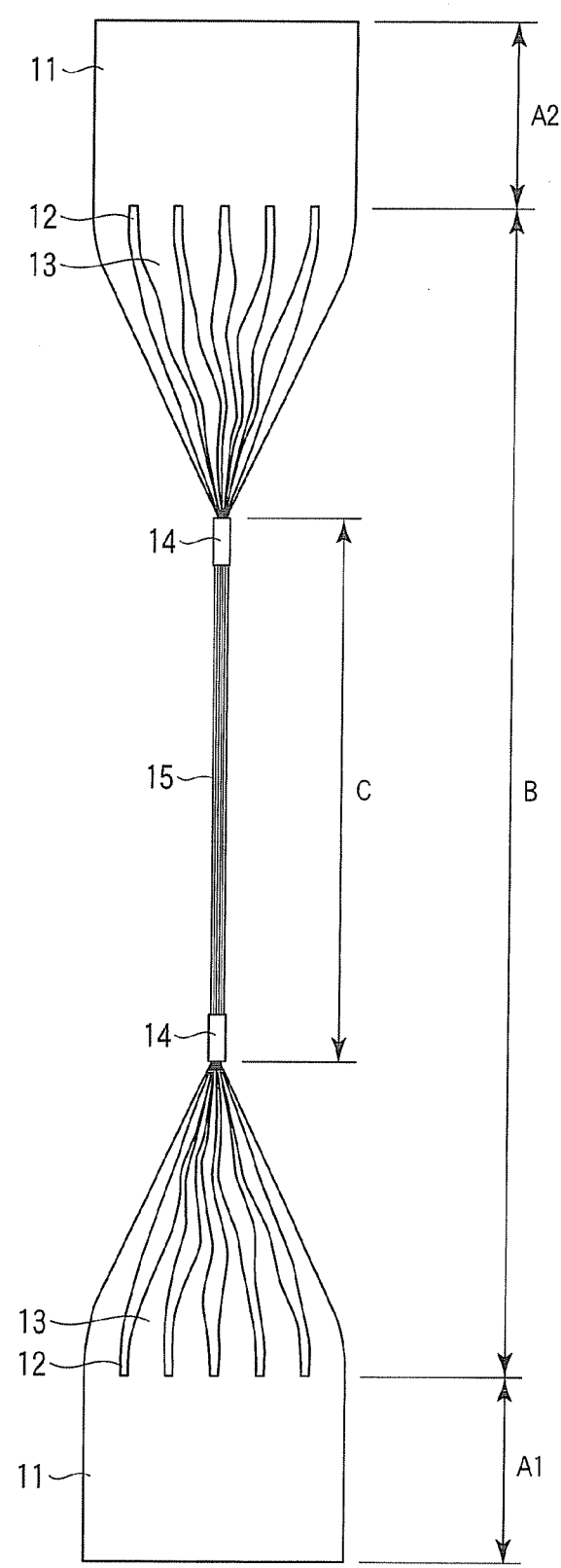
FIG. 1 is a schematic top view showing a flexible wiring board according to a first embodiment.

FIG. 1 is a top view showing the schematic configuration of a flexible wiring board according to a first embodiment.

One FPC comprising a flexible wiring board on which a plurality of wires are arranged in parallel along one direction comprises end regions 11 (A1, A2) used to maintain the wiring array state and a wiring region B sandwiched between the end regions A1 and A2. By forming a plurality of slits 12 in the wiring region B, the wiring region B is formed into flexible wiring fins (which are hereinafter simply referred to as wiring fins) 13 separated by the slits 12. A bundled region C is formed by bundling the wiring fins 13 at, for example, two portions inside the wiring region B by use of binding bands 14. The bundled region C is a region in which the wiring fins 13 are bundled and is used as a flexible wiring bundle 15 that can be bent in both of a normal direction (perpendicular to the drawing sheet) and a horizontal direction (parallel to the drawing sheet) with respect to the plane of the end regions 11.

As a configuration example of the flexible wiring board of this embodiment, for example, a three-layered laminate body configured by an FPC base film of polyimide with a thickness of 25 μm, a Cu foil with a thickness of 25 μm used as an electrical wire and a cover lay of polyimide with a thickness of 25 μm is provided. The whole size of the FPC is set such that the width is 10 mm and the length is 150 mm. Both end portions of 10 mm of the FPC are left behind as the end regions 11 and slits 12 with the width of 0.1 mm are formed at a one-mm interval in the wiring region B by means of a laser cutter to form ten wiring fins 13 having a width of 0.9 mm and a length of 130 mm.

It is preferable to form all of the wiring fins 13 with substantially the same width because they are bundled. It is needless to say that a wiring pattern of Cu, for example, is not formed in a portion in which the slits 12 are formed. Further, it is substantially necessary to set the width of the wiring fin 13 less than or equal to 1/10 of the length of the wiring region from the viewpoint of flexibility and it is preferable to set the width thereof less than or equal to 1/100 of the length of the wiring region as far as possible. This is applied to the following embodiments.

Next, the wiring fin group is sequentially superimposed in an arranged order and collected and bundled at two or more portions as shown in FIG. 1 by use of fluororesin-series seal tapes as the binding bands 14, for example. The length of the bundled region C is set to 100 mm, for example, and is preferably set in substantially the central portion of the wiring region B. At this time, in order to remove slack or stress between the wiring fins 13, it is desirable to use a tape having no adhesive agent for the binding band 14 so as to move the wiring fins 13 inside the binding band 14 formed in a ring form.

The distances between the wiring fins 13 are gradually reduced towards the bundled region C between the end region 11 and the bundled region C and the adjacent wiring fins 13 are superimposed by use of the binding band 14 to form the flexible wiring bundle (flexible portion) 15. At this time, the distance from the end region 11 to the bundled region C of the wiring fins lying outside the wiring fin group becomes longer than that of the wiring fins lying inside the wiring fin group. Therefore, if the two end regions 11 are stretched in directions of both ends of the flexible wiring board, tensile force is applied only to the outermost wiring fins and the bundled region C is stretched to stand in a normal direction (perpendicular to the drawing sheet) with respect to the plane of the end regions 11. If the wiring fins 13 are superimposed in an array order of the wiring fins 13 and the binding band 14 bundles them to uniformly set the widths of the wiring fins 13, the same result can be attained irrespective of the combination (opposition of the front (back) surfaces or opposition of the front and back surfaces) of superposition of the wiring fins. Then, the plane of the wiring fins 13 becomes a plane at an angle different from the plane of the end region 11 and is stabilized.

Therefore, in the case of this embodiment, the bending operation of a film (flexible wiring board) that has been less flexible in a horizontal direction (parallel to the drawing sheet) becomes particularly easy. At this time, as the movable space of the flexible wiring bundle 15, free space height corresponding to the width of the wiring fin 13 is required. However, if the required space height is limited, it can be coped with by limiting the width of the wiring fin 13 accordingly. For example, in the above-described example, the width of the wiring fin 13 is 0.9 mm and the bending operation in the horizontal direction can be sufficiently attained if the free space height of 1 mm is provided. If the space height is limited to a value less than the above space height, it is sufficient to further narrow the width of the wiring fin 13.

Further, in the normal direction (perpendicular to the drawing sheet) in which the film is originally highly flexible, the film can be bent by grasping an intermediate portion of the flexible wiring bundle 15 and twisting the same with the wiring direction set as an axis to cause twisted bending and no specially serious problem does not occur. In this case, the flexibility can be increased by limiting the width of the wiring fin 13 and it is sufficient if the width of the required free space (the width in a direction perpendicular to the bending locus surface) has width corresponding to the width of the wiring fin 13 is provided.

In the above explanation, the wiring fins 13 are used in a simply bundled state, but this invention is not limited to this case. For example, it is possible to previously give a twist of 1/4 rotation, half rotation, 3/4 rotation or one rotation to the flexible wiring bundle 15 with the wiring lengthwise direction set as an axis. Thus, the bending anisotropy in the horizontal and vertical directions becomes less and it becomes possible to provide wirings for boards whose mounting surfaces are different by 90°.

It becomes possible to connect the front and back surfaces of the FPC without using board penetration electrodes such as penetration vias by giving a twist of half rotation to the flexible wiring bundle 15. That is, in a general FPC, a so-called double-sided board comprising Cu wires on both of the upper and lower surfaces of a base film is used and the front and back surfaces thereof are electrically connected by connecting the upper and lower wires by use of penetration vias. On the other hand, in the flexible wiring board of this embodiment, wiring corresponding to the upper and lower wiring electrodes can be attained by a twist of half rotation of the flexible wiring bundle 15 as described above. Further, wiring corresponding to the upper and lower wiring electrodes can be attained without using a penetration via process in an FPC with one-side electrodes. Therefore, it can be realized at extremely low cost.

Second Embodiment

Figure 2:
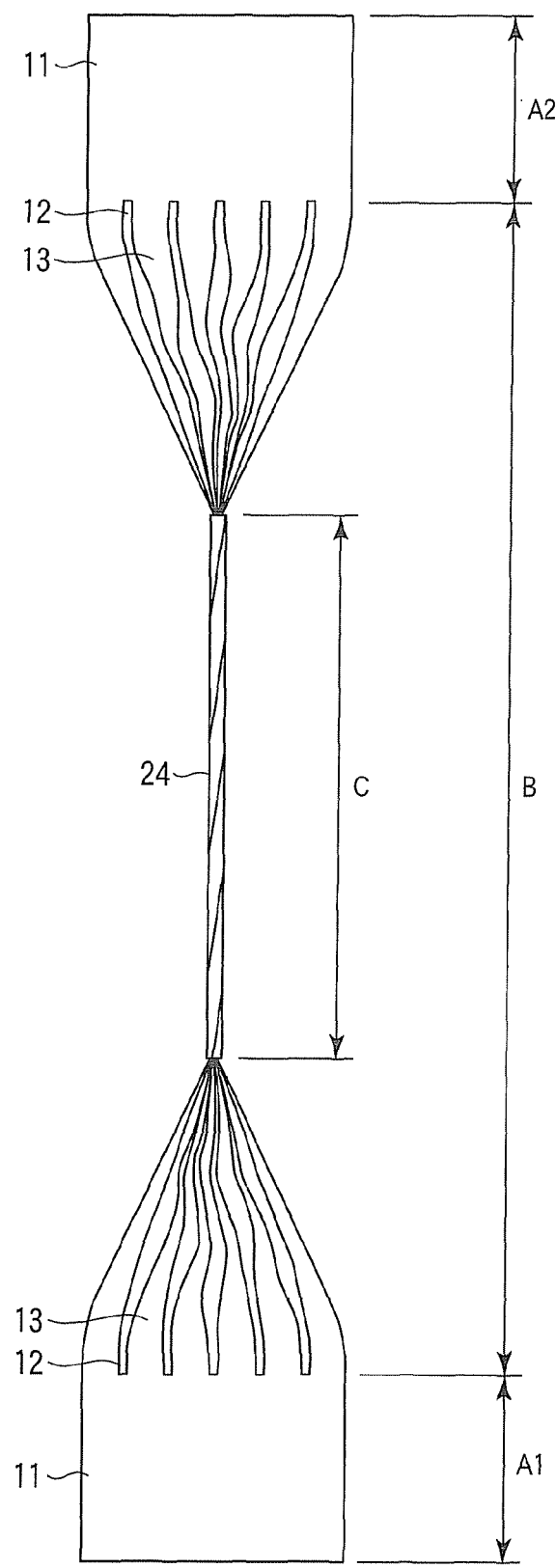
FIG. 2 is a schematic top view showing a flexible wiring board according to a second embodiment.

FIG. 2 is a top view showing the schematic configuration of a flexible wiring board according to a second embodiment.

In FIG. 1, an example in which the ends of the bundled region C are bundled and the flexible wiring bundle 15 is not bundled is shown. In the case of an application method in which it is bent only in the horizontal direction (parallel to the drawing sheet) with respect to the plane of the end region 11, the whole portion of the bundled region C may be bundled by use of a binding band 24 such as a fluoroplastics-series seal tape as shown in FIG. 2. In this case, occurrence of an accident in which part of the wiring fins 13 (for example, wiring fins lying inside the wiring fin group) protrude from an intermediate portion of the bundled region C, gets caught in and on the surrounding concave and convex portions and is damaged can be prevented.

That is, in the embodiment of FIG. 1, tensile force is applied only to the outermost wiring fin and a state in which wrinkles that absorb slackness occur between the end region 11 and the bundled region C and no tensile force is applied is created because the internal wiring fins become excessively long. Therefore, there may sometimes occur a problem that the flexible wiring bundle 15 gets caught in or on the surrounding concave or convex portions and is damaged or a problem that the internal wiring fins protrude from the flexible wiring bundle 15, similarly get caught in or on the surrounding concave or convex portions and is damaged. In this embodiment, occurrence of the above problem can be prevented without fail.

Further, in this embodiment, flexibility in the normal direction (perpendicular to the drawing sheet) is not eliminated and the anisotropy (the flexibility in the direction perpendicular to the drawing sheet is small with respect to the flexibility in the direction parallel to the drawing sheet) is increased to some extent. In this case, the anisotropy can be alleviated by bundling the wiring fins after giving a twist of ¼ rotation, half rotation, ¾ rotation or one rotation thereto with the wiring lengthwise direction set as the axis.

Third Embodiment

Figure 3:
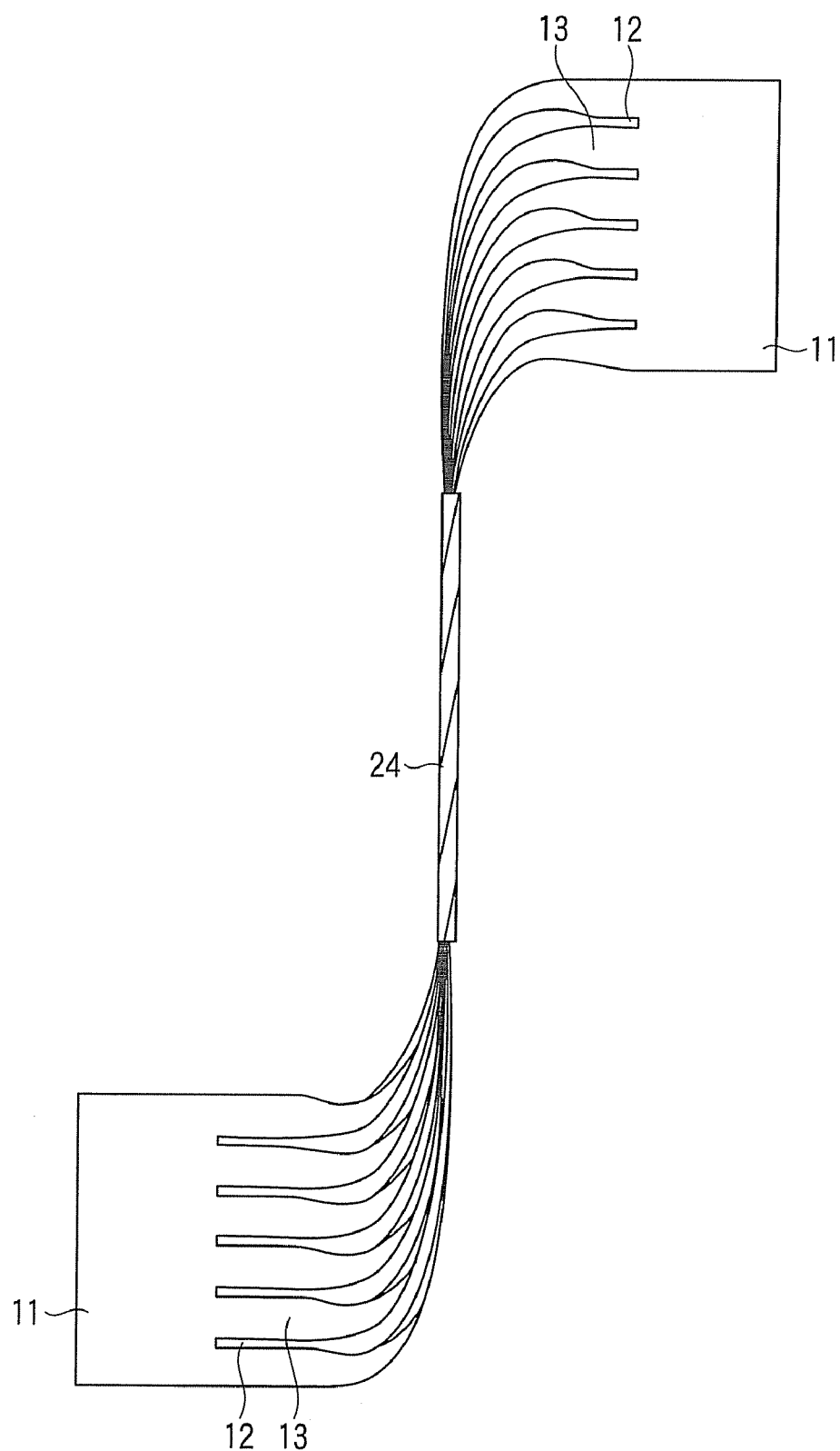
FIG. 3 is a schematic top view showing a flexible wiring board according to a third embodiment.

FIG. 3 is a top view showing the schematic configuration of a flexible wiring board according to a third embodiment and shows an example in which end regions A1, A2 and a wiring region B are bent in a crank form and arranged.

In the embodiments shown in FIG. 1 and FIG. 2, there may occur a problem that tensile force is applied only to the wiring fins on both outer sides of the wiring fin group and the tensile resistance of the flexible wiring is determined only by the tensile resistance of the two outside wiring fins. That is, in the embodiments shown in FIG. 1 and FIG. 2, a problem that the two outside wiring fins of the wiring fin group tend to be damaged by application of mechanical tensile force.

Further, in the embodiments shown in FIG. 1 and FIG. 2, since the internal wiring fins of the wiring fin group become loose, wrinkles that absorb slackness occur between the end region 11 and the bundled region C and the wiring fins tend to get caught in or on the surrounding concave or convex portions. Therefore, there occurs a possibility that it is unsuitable for high-density mounting because an extra wiring space becomes necessary and local damages occur at the time of application to a movable portion in which bending or twisting operations are violently performed In view of the above problem, in the embodiment of FIG. 3, the two end regions A1, A2 and wiring region B are arranged in a crank form to uniformly apply tensile force to all of the wiring fins 13. By thus arranging the regions in the crank form, the lengths of the wiring paths become uniform and, as a result, the required lengths of the wiring fins 13 become uniform. Therefore, tensile force is prevented from being concentrated in part of the wiring fins. Further, since the entire portion of the wiring fin group is uniformly stretched, the degree of linearity of the wiring fins 13 in the bundled region C is enhanced and part of the wiring fins can be prevented from being scattered.

In this embodiment, since the wiring fins 13 are uniformly arranged, tensile force of the flexible wiring board is dispersed to the wiring fins 13 and wrinkles will not occur in part of the wiring fins. However, the wiring fins 13 are bent in a 90° direction between the end region 11 and the bundled region C and force that is applied in a direction to restore the bending of the wiring fins 13 is applied to the bundled region depending on the FPC board structure. Therefore, in the case of a board structure in which repellent force applied to restore the wiring fins 13 to the original form is strong, it is effective to provide a binding band 24 for the entire portion of the bundled region C so as not to scatter the wiring fins 13. That is, in the embodiment of FIG. 3, the crank form can be maintained if the wiring fins in the bundled region C are not shifted from one another. The crank form can be easily maintained by bundling the whole portion of the bundled region C to increase friction force between the wiring fins.

Figure 4A:
FIGS. 4A to 4E are schematic top views showing the manufacturing steps of the flexible wiring board according to the third embodiment.

FIGS. 4A to 4E show one example of the manufacturing steps of the crank type flexible wiring board shown in FIG. 3. FIG. 4A shows a state in which the normal FPC manufacturing step is terminated and shows a stage in which wiring of a Cu wiring pattern and the like is terminated. That is, although not shown in the drawing, a plurality of wires are arranged along the horizontal direction of the drawing sheet of the flexible wiring board 10. As described before, at this stage, the wires are not provided in portions in which slits are formed.

Figure 4B:
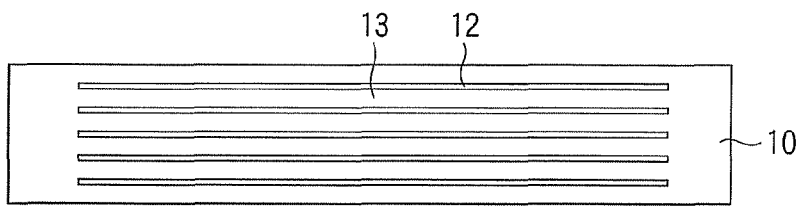

FIG. 4B shows a step in which a plurality of slits 12 are formed to separate the wiring fins 13. For formation of the slits 12, router processing such as mold punching or mechanical cutting can be used in addition to the laser processing. In FIG. 4A, a case wherein the outer form is already formed into an FPC form is described, but it is efficient to perform the outer form processing step at the stage of FIG. 4B and the steps shown in FIGS. 4A and 4B generally become the same step in many cases.

Figure 4C:
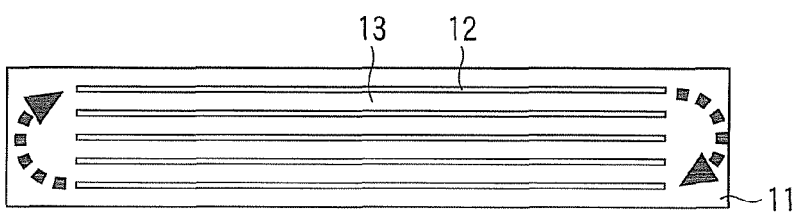
Figure 4D:
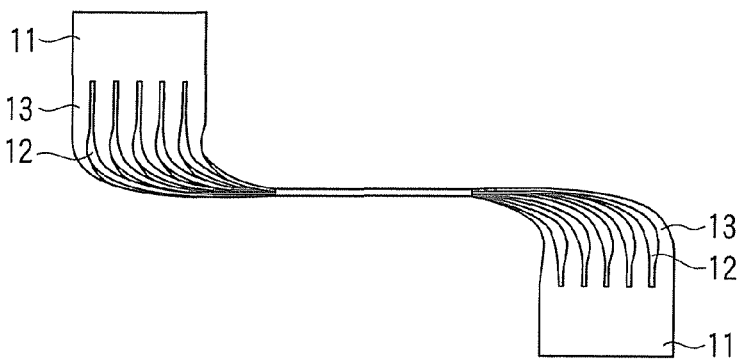
Figure 4E:
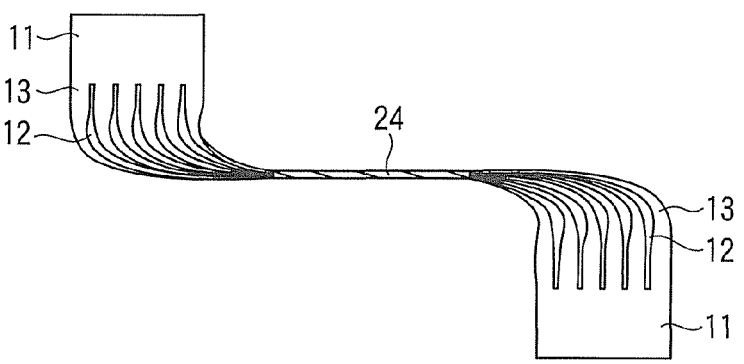

Next, the two end regions 11 are rotated simultaneously in two portions in an in-plane direction (clockwise direction) as shown by arrows indicated by broken lines in FIG. 4C. By the above operation, the wiring fins 13 are twisted and attracted to one another. At this time, if adequate tensile force is applied to the end regions 11 while the positions thereof are shifted as shown in FIG. 4D according to the directions in which the end regions 11 are rotated, the wiring fins 13 are neatly arranged and bundled into a band while they are superimposed with the front and back surfaces of the wiring fin 13 set to face the adjacent wiring fins. By winding the binding band 24 while maintaining this state, a crank type flexible wiring board is completed as shown in FIG. 4E.

At this time, the wiring fin group of the bundled region C is set in a state in which it stands in a direction perpendicular to the plane of the end region 11 in many cases. This is because the repellent force of restoring the wiring fins 13 into an original form and the force of bending the wiring fins 13 by 90° into a crank form tend to be well balanced when the wiring fins 13 are set in a vertical direction. Further, this is because the wiring fins can be more easily set in a vertical direction by bundling a plurality of wiring fins 13. However, if the wiring fins 13 are extremely soft and the repellent force of the wiring fins 13 is relatively weak, for example, they are soft so that the FPC will droop to the base due to its own weight, the wiring fins 13 of the bundled region C will become more stable when they are bent by an angle of 90° or more with respect to the plane of the end regions 11. This is explained in the next embodiment.

As the method for bundling the wiring fins 13, a method for bundling the wiring fins in a natural form by laminating adjacent wiring fins 13 on both sides of the slit 12 with the front surface of one wiring fin set to face and superimposed on the back surface of the other wiring fin. This is based on the following reason. That is, when the wiring fins 13 are bundled, they are bundled with the wiring fins 13 standing in the vertical direction. At this time, the wiring fins 13 lying near the end regions are twisted by 90° and a natural bundled state can be attained if the twisting directions are set to the same direction. In contrast, if some of the wiring fins 13 are twisted in a different direction from the twisting direction of the remaining wiring fins, a locally folded portion occurs at the operation time of the movable portion on which the flexible wiring board is mounted and it tends to be damaged in this portion.

Fourth Embodiment

Figure 5:
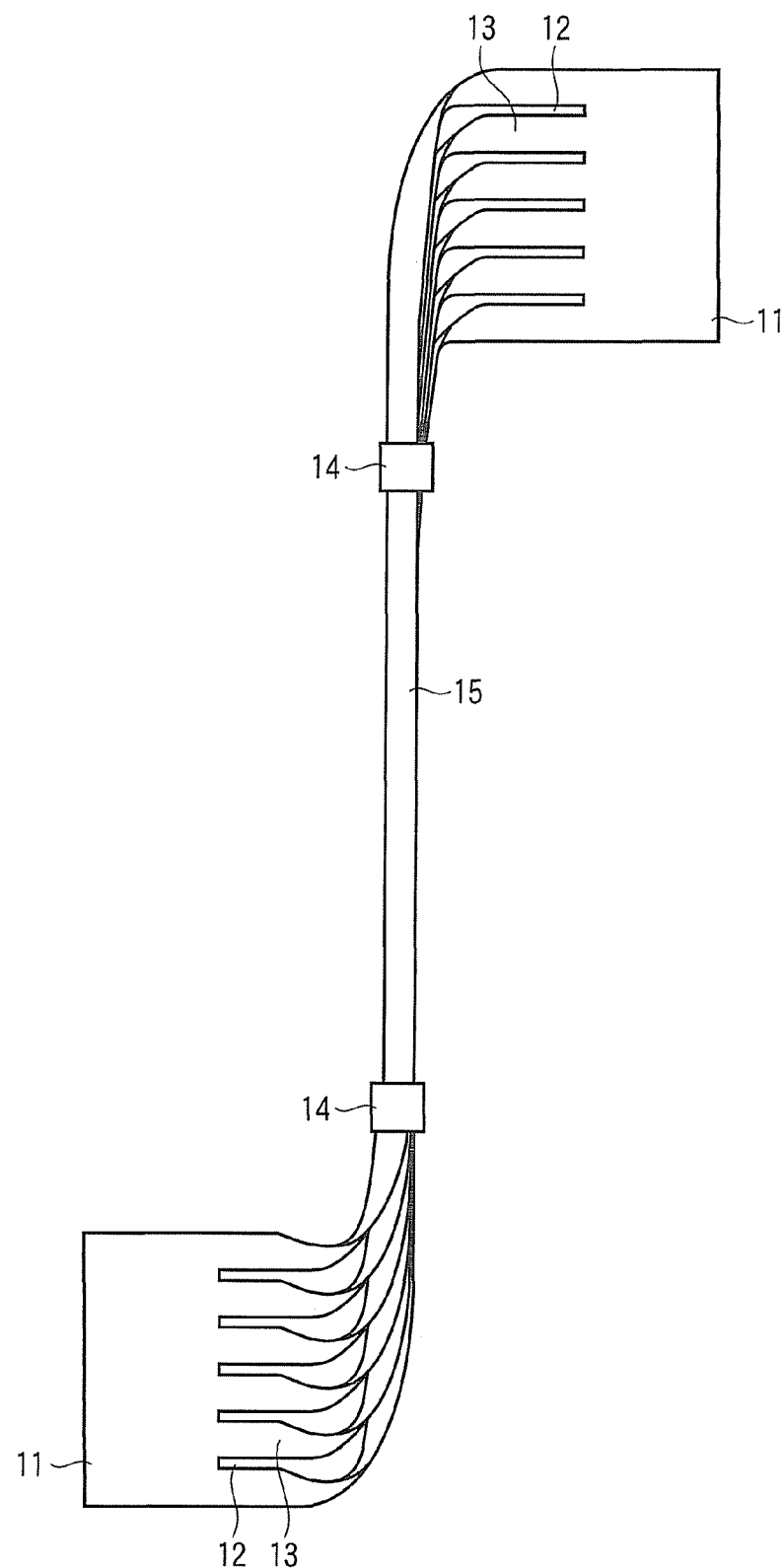
FIG. 5 is a schematic top view showing a flexible wiring board according to a fourth embodiment.

FIG. 5 is a top view showing the schematic configuration of a flexible wiring board according to a fourth embodiment and shows an example in which end regions 11 and a wiring region B are bent in a crank form and arranged.

This embodiment is different from the embodiment of FIG. 3 in that the original material of the FPC is soft and large repellent force does not occur even if wiring fins 13 are bent in a crank form. With such a soft board, the bundled region C is twisted to an angle exceeding the right angles with respect to the original plane when the end regions 11 are stretched in the lengthwise direction of the bundled region while maintaining the crank form. If it is extremely soft, the bundled region C may be twisted by approximately 180° in some cases.

In such a case, a fray of the crank form due to elasticity of the wiring fins 13 becomes difficult to occur and the binding bands 14 may be provided at two portions as shown in FIG. 5. Of course, the whole portion of the bundled region C may be bundled as in the embodiment of FIG. 3.

With the above configuration, the flexibility in the normal direction (perpendicular to the drawing sheet) of the end regions 11 becomes highest and bending in the horizontal direction (parallel to the drawing sheet) can be attained without causing any problem because the bundled region C or the flexible wiring bundle 15 tends to be twisted. Further, the bending anisotropy in the horizontal direction and normal direction can be suppressed by previously giving a twist of half rotation or one rotation to the bundled region C or the flexible wiring bundle 15.

If the board structure with weak elasticity of the wiring fins 13 is used, it is possible to previously twist the bundled region C by 180° and twist the base portions of the wiring fins 13 near the end regions by 90° to put creases and fold the same. In this case, a portion in which the wiring fins 13 are folded by 90° is not used for a mechanically movable portion and is arranged in a portion that is used in a fixed state.

Figure 6:
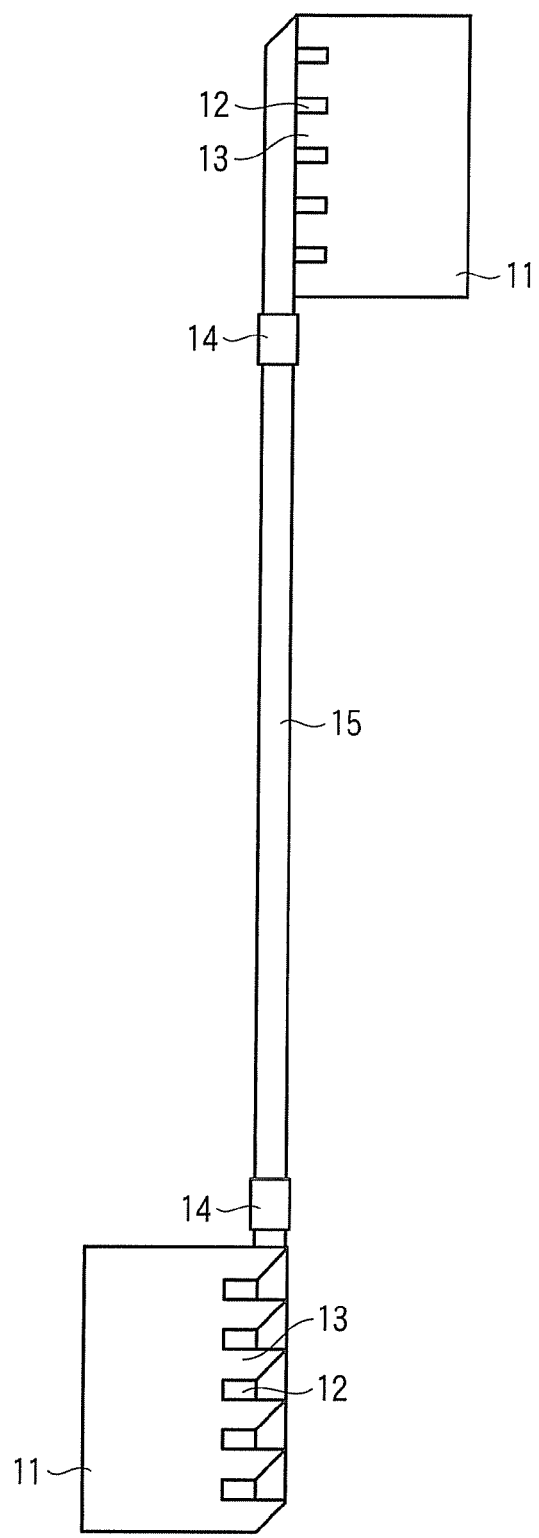
FIG. 6 is a schematic top view showing the flexible wiring board according to the fourth embodiment.

In the case of the embodiment of FIG. 6, since the length of a portion of the wiring fins 13 that is bent by 90° is short, an advantage that the bundled region C can be made longer accordingly is attained. Further, since the bent portion of the wiring fins 13 can be made flat in mounting, an advantage that the free space height of the bent portion can be set approximately equal to the film thickness is attained.

Fifth Embodiment

Figure 7:
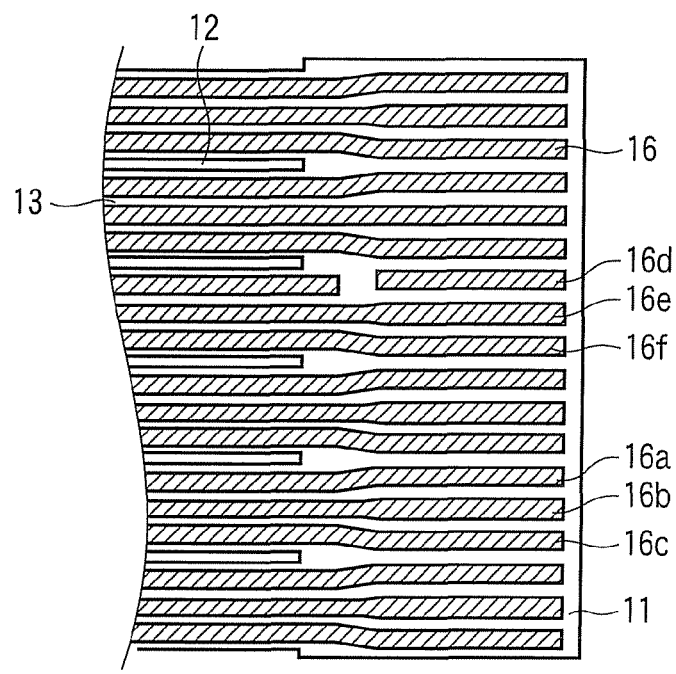
FIG. 7 is a schematic top view showing a flexible wiring board according to a fifth embodiment.

FIG. 7 is a top view showing the schematic configuration of a flexible wiring board according to a fifth embodiment and shows a portion near the boundary between an end region 11 and a wiring region B in more detail. In FIG. 7, a reference symbol 16 denotes electrical wires (Cu foil pattern) and a state in which upper coating resin such as a cover lay is removed is shown.

The feature of this embodiment is that the electrical wiring pattern in a portion of the wiring fins 13 is formed in the same form in all of the wiring fins 13. For example, a so-called coplanar guide in which 16a, 16c are ground lines and 16b is a signal line is used as one wiring unit and the electrical wires of the same pattern are provided for the wiring fins 13.

A portion that requires a high-frequency signal is connected as a coplanar guide and the electrical wires 16a to 16c used for a low-frequency signal and power source wires are connected as three independent electrical wires. Further, when all of the electrical wires on the wiring fins 13 are not required, unnecessary electrical wires are not connected as a dummy wiring pattern or are replaced by wires such as power source lines or ground lines in which resistance reduction is important while all of the electrical wires are kept in the same form.

As one example, 16d is a line that is not required to be connected, but is left behind as a dummy line whose intermediate portion is not connected as shown in FIG. 7 to set the electrical wiring pattern of the wiring fins 13 in correspondence to the other wiring fins. At this time, 16e, 16f can be used as a low-speed signal wire and power source wire.

By thus setting the electrical wiring pattern in the portion of the wiring fins 13 to the same form, the rigidities, elasticities and thermal expansion characteristics of the wiring fins 13 can be made equivalent. Therefore, the wiring fins with low rigidity may be suppressed from being damaged due to application of the stress and friction between the wiring fins 13.

Sixth Embodiment

Figure 8:
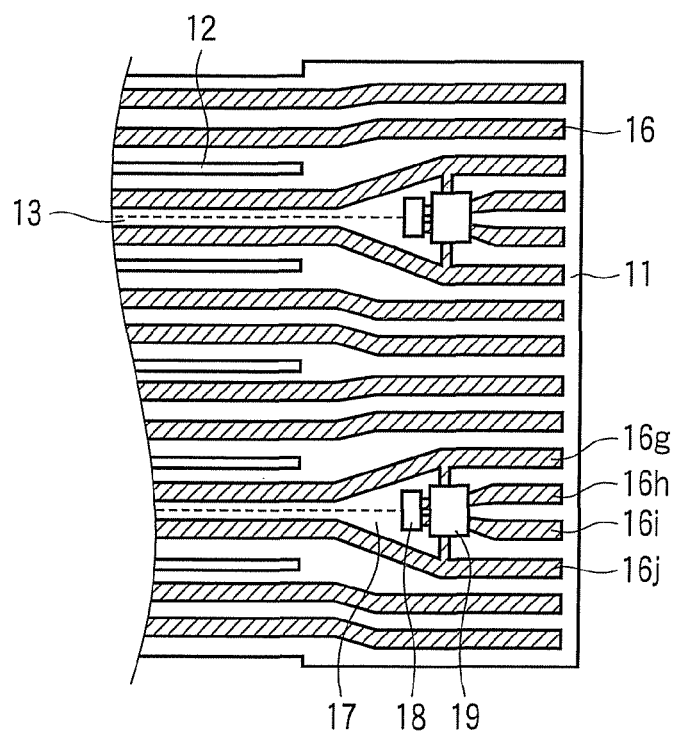
FIG. 8 is a schematic top view showing a flexible wiring board according to a sixth embodiment.

FIG. 8 is a top view showing the schematic configuration of a flexible wiring board according to a sixth embodiment and shows a portion near the boundary between an end region 11 and a wiring region B in more detail. In FIG. 8, a reference symbol 17 denotes an optical wire (optical wave-guide core), 18 denotes an optical semiconductor element (light emitting element or light receiving element) and 19 denotes a drive IC for the optical semiconductor element 18 and a state in which upper coating resin such as a cover lay is removed is shown.

The feature of this embodiment is that signal interference between the wiring fins 13 can be suppressed by transmitting a high-speed signal by use of light. In the flexible wiring board of this embodiment, since the wiring fins 13 are laminated over a distance corresponding to the thickness of the flexible wiring board, the distance between the electrical wires in the bundled region is shorter in comparison with a case of the FPC of a flat board. Therefore, a high-speed signal that passes through one of the wiring fins 13 tends to be coupled with the electrical wire of the other wiring fin and so-called cross talk tends to occur.

In order to solve the above problem, it is effective to provide a plane-form or net-form ground or shield electrode on the back surface of the wiring fins 13. However, this method causes a problem that the rigidity of the wiring fins 13 is increased and the flexibility of the wiring fins 13 is lowered. Therefore, as shown in FIG. 8, it is further preferable to use an optical-electrical compound wire that transmits a high-speed signal by use of light.

In FIG. 8, a reference symbol 16g denotes a power source wire of the drive IC 19, 16h, 16i denote different signal input (or output) terminals, and 16j denotes a ground wire of the drive IC 19. Electrical power required for an optical interface can be supplied from only one of the light transmission side and light reception side by previously setting the electrical wire 16g and ground wire 16j in parallel on the light transmission side and light reception side.

Figure 9:
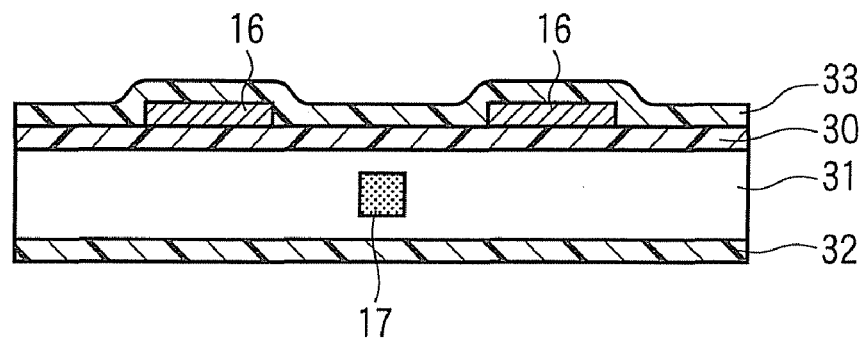
FIG. 9 is a schematic cross-sectional view showing the flexible wiring board according to the sixth embodiment.

Further, the optical wave-guide core 17 is configured with the surrounding portion thereof surrounded by a clad 31 for optical confinement as shown in FIG. 9 and is basically formed of a resin material. FIG. 9 is a cross-sectional view obtained by cutting the wiring fins 13 of FIG. 9 in a crosswise direction, 16 denotes an electrical wire (for example, Cu foil, Ag foil), 17 an optical wave-guide core, 30 a base film (for example, polyimide film), 31 an optical wave-guide clad, 32 a back surface cover (for example, polyimide film) and 33 a cover lay (for example, polyimide film).

As an optical wave-guide material (core 17 and clad 31), for example, epoxy-series resin, acryl-series resin or polyimide-series resin can be used. A material or a material containing an adequate amount of additive is used to set the refractive index of the optical wave-guide core 17 higher than that of the clad 31. Further, the optical coupling between the optical wave-guide core 17 and the optical semiconductor element 18 can be realized by providing a 45° mirror on the optical wave-guide core 17 in the mounting position of the optical semiconductor element, for example.

Further, as shown in FIG. 8, in this embodiment, the electrical wiring pattern in the wiring fin portion is formed in the same form as the other wiring fins. Since the optical wave-guide core 17 is formed of substantially the same material as that of the optical wave-guide clad 31 and the refractive index is slightly different from that of the latter, the wiring fins in which the optical wave-guide core 17 is provided and the wiring fins in which the optical wave-guide core 17 is not provided have substantially the same rigidity and no particularly large difference in the mechanical characteristic occurs. Therefore, as shown in the embodiment of FIG. 7, the effect attained by forming all of the electrical wiring patterns in the same form can be realized.

With the above configuration, if optical wires are provided in the flexible wiring board of this embodiment, signal interference caused by setting an electrical wire of the wiring fin 13 closer to an electrical wire of the other wiring fin 13 can be suppressed and high-speed and high-quality signal transmission can be attained.

Since the optical wires can cope with high-speed signals of 10 Gbps or more, it is possible to bundle and transmit almost all high-speed signals. However, it is generally single-direction transmission and if the high-speed signal is transmitted in two directions, it is desirable to provide two lines of a transmission line and reception line.

Seventh Embodiment

Figure 10:
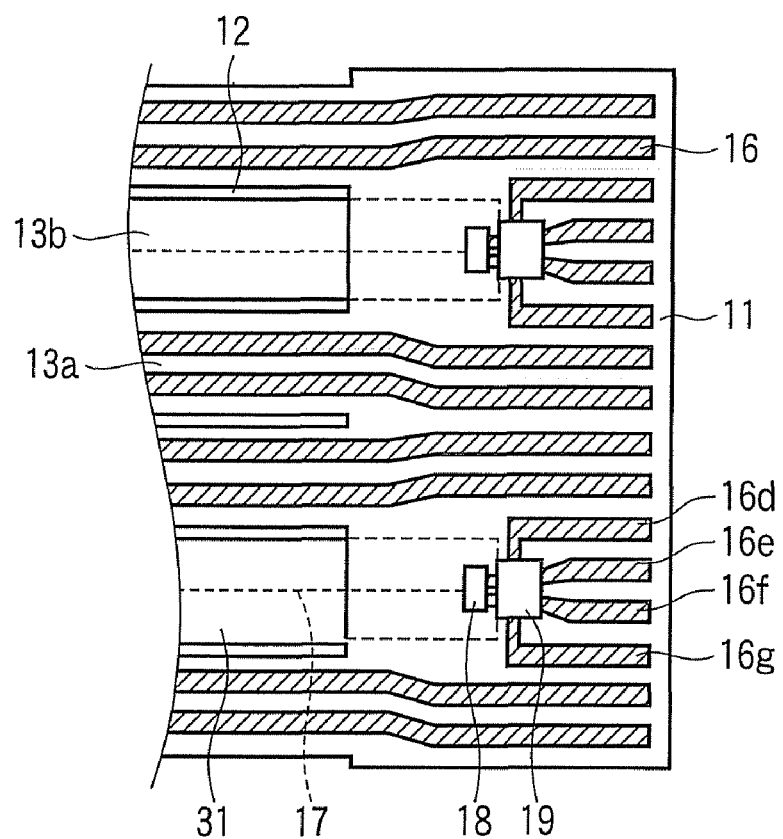
FIG. 10 is a schematic top view showing a flexible wiring board according to a seventh embodiment.

FIG. 10 is a top view showing the schematic configuration of a flexible wiring board according to a seventh embodiment and shows a portion near the boundary between an end region 11 and a wiring region B in more detail. In FIG. 10, a reference symbol 17 denotes an optical wire (optical wave-guide core), 18 an optical semiconductor element (light emitting element or light receiving element), 19 a drive IC for the optical semiconductor element 18 and 31 an optical wave-guide clad and a state in which upper coating resin such as a cover lay is removed is shown.

The feature of this embodiment is that an optical wiring fin is not formed by laminating optical wiring lines but is formed by attaching an optical wiring film 13b that is separately formed with the width less than or equal to that of a wiring fin 13a. In this embodiment, since it is not necessary to form the optical wave-guide clad in a portion in which no optical wires are provided, it is possible to realize the feature that the wiring fins can be formed thin and flexible in comparison with a case wherein it is formed by laminating the electrical wires and optical wires as shown in FIG. 9. Further, since the amount of optical wiring films 13b used is greatly reduced, the cost of the optical-electrical compound flexible wiring board can be reduced.

As the structure of the optical wiring film 13b, a film configured only by the optical wave-guide core 17 and clad 31 of FIG. 9 or a film configured by providing cover lays on the upper and lower surfaces of the optical wave-guide core 17 and clad 31 may be used. The thus configured film may be attached to a wiring board via an adhesive layer by use of a method of vacuum lamination or the like. Further, a 45° mirror (not shown) that causes the optical coupling between the optical wave-guide core 17 and the optical semiconductor element 18 is formed after the optical wiring film 13b is attached to the end region 11 and, as a result, it becomes easy to align the same with the electrical wiring pattern 16 in the axial direction of the optical wave-guide core.

In this embodiment, since the materials of the wiring fin 13 and the optical wiring fin are different, the mechanical characteristics thereof are generally different. However, since they can be formed of a combination of different materials, a material selected by considering the characteristic thereof when it is sandwiched between the wiring fins 13a and applied to a movable portion can be used to form the optical wiring fin. For example, a highly flexible material is used for the optical wiring film 13b while considering the friction resistance with the wiring fin 13a. With this configuration, it is possible to prevent occurrence of a problem that the spring characteristic due to the rigidity of the wiring fin 13a becomes dominant in the mechanical characteristic of the bundled region, mechanical interference occurs between the wiring fin 13a and the optical wiring fin and one of them is damaged.

Eighth Embodiment

FIG. 11 is a top view showing the schematic configuration of a flexible wiring board according to an eighth embodiment and shows a device in which a fixed circuit board (first board) 51 and a movable circuit board (second board) 61 are connected by means of a flexible wiring board.

In FIG. 11, a reference symbol ha denotes a fixed board side-end region, 11b a movable board side-end region, 51a fixed board, 52 a binding guide on the fixed board, 53 an anisotropic conductive film (ACF) for electrically connecting the electrode of the end region ha to the electrode of the fixed board 51, 61 a movable board, 62 a binding guide on the movable board, 63 an ACF for electrically connecting the electrode of the end region 11b to the electrode of the movable board 61, and 70 a device casing.

The flexible wiring board used here is of a crank type shown in FIG. 3 and wiring fins 13 are bundled by use of the binding guides 52, 62 instead of the binding band 24 used in FIG. 3. Further, the end regions 11a, 11b are electrically connected to the respective boards via the ACFs and mechanically adhered to and fixed on them. That is, since the angles of the end regions 11a, 11b are fixed and the base portions of the wiring regions are bundled by means of the binding guides 52, 62, the same arrangement relation as that shown in FIG. 3 can be attained even if the binding band 14 or 24 is not used. Therefore, the configuration equal to that of the embodiment shown in FIG. 3 can be equivalently realized by using the binding guide or the like instead of the binding band when the flexible wiring board in the embodiment of FIG. 3 is incorporated into the device. The embodiment of FIG. 11 corresponds to a state in which the bundled region C in the embodiment of FIG. 3 is bent by 180° in the horizontal direction (parallel to the drawing sheet).

Figure 12:
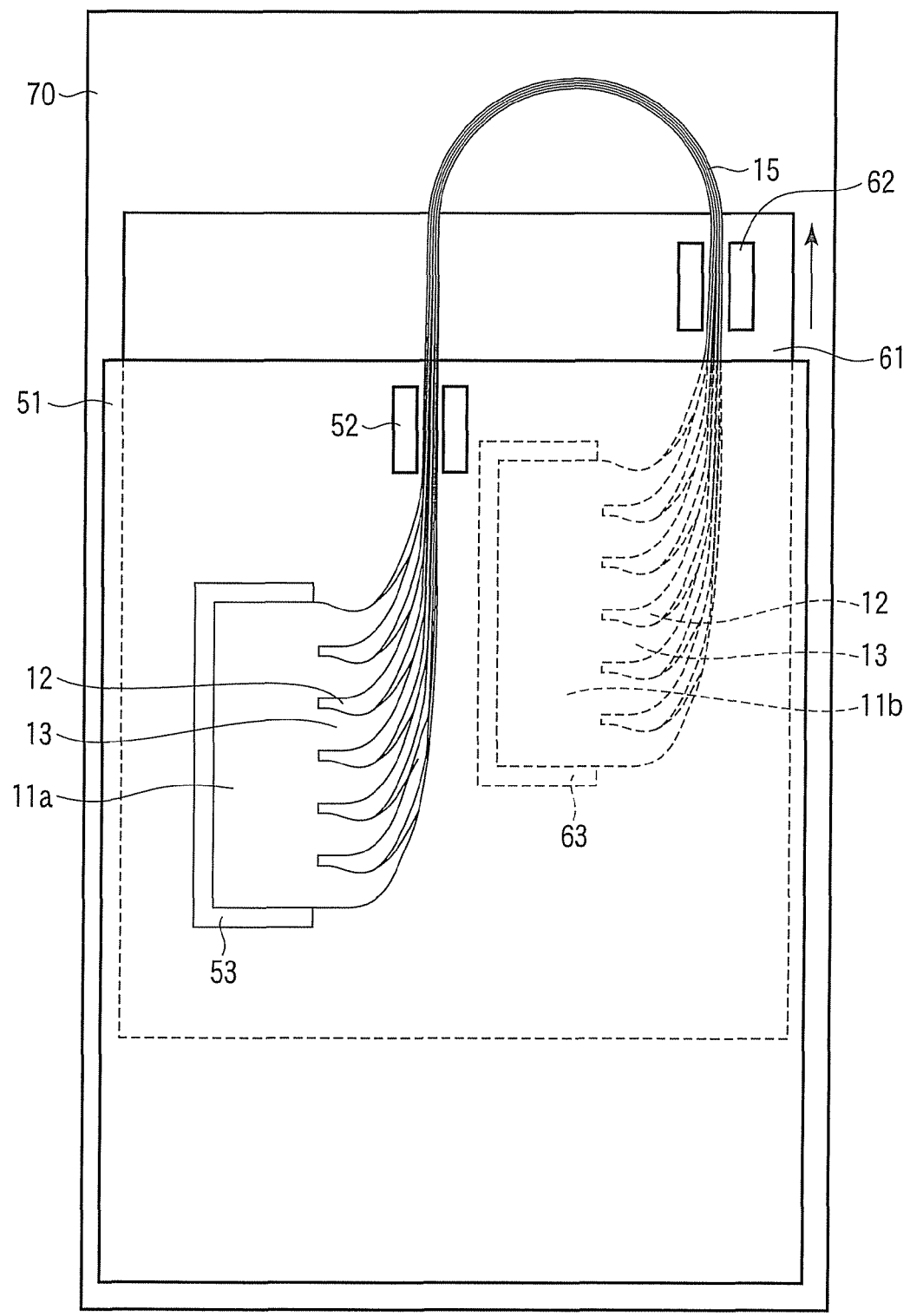
FIG. 12 is a schematic top view showing the flexible wiring board according to the eighth embodiment.

In the embodiment of FIG. 11, the wiring fins 13 are bundled so that the wiring fins 13 will be set perpendicular to the plane of the end regions 11a, 11b in the bundled regions (regions sandwiched between the two binding guides 52, 62). Thus, the flexible wiring bundle 15 can be easily bent in the horizontal direction (parallel to the drawing sheet). In this case, when the movable board 61 is slid in an upper direction as shown in FIG. 12, the semi-circular bending portion of the flexible wiring bundle 15 is gradually fed and moved and it is deformed into a form as shown in FIG. 12.

At this time, the flexible wiring bundle 15 is deformed with relatively gentle curvature (semi-circle shown in FIG. 11, FIG. 12, for example, the radius of curvature R=10 mm) and the mechanical load on the flexible wiring board becomes relatively small. As shown in FIG. 13, the step difference between the fixed board 51 and the movable board 61 can be reduced to the width of the wiring fin 13. For example, when the thickness of the fixed board 51 and movable board 61 is 0.6 mm and the width of the wiring fin 13 is 0.9 mm, it is sufficient if a gap of approximately 1 mm between the upper and lower boards (fixed board 51 and movable board 61) is provided.

If a general FPC is bent and the upper and lower boards are connected as shown in FIG. 13, they are connected over a step difference of 1.6 mm in total of the step difference of 1 mm between the upper and lower boards and the thickness of 0.6 mm of the fixed board 51 in a folded-back form. In this case, the radius of curvature R of the bending portion of the FPC becomes as small as 0.8 mm. Generally, it is understood that the minimum radius of curvature of the FPC used for the movable portion is limited to R=1 mm, and even if it can be realized, the reliability of bending becomes significantly different from the reliability of bending in the case where the flexible wiring board of this embodiment is used. Further, if connection as shown in FIG. 13 is made in the general FPC, the surfaces of the upper and lower boards with which the FPC makes contact become opposite. Therefore, it becomes necessary to use front-back connection by means of board penetration vias in a double-sided wiring board with electrical wires on both of the front and back surfaces of the FPC and thus a problem that the FPC cost rises will occur.

In order to make equivalent connection to that of FIG. 13 by means of a single-sided wiring board of a general FPC, the opposite surfaces of the upper and lower boards (the lower surface of the upper board and the upper surface of the lower board) or the outside surfaces of the upper and lower boards (the upper surface of the upper board and the lower surface of the lower board) are connected.

In the former case, the bending height of the FPC is 1 mm (R=0.5 mm) in the former example and, if the gap between the upper and lower boards is further reduced, R becomes smaller than 0.5 mm and it cannot almost be realized. Therefore, in this case, it is necessary to set the gap between the upper and lower boards to 2 mm (R=1 mm) at minimum.

In the latter case, the bending height of the FPC is 2.2 mm (R=1.1 mm) in the former example and, if the gap between the upper and lower boards is set to 0.9 mm, the radius of curvature (R) becomes 1 mm and it can be realized even though it is in a limited region. However, in this case, it is necessary to uselessly set a gap of 0.9 mm between the upper and lower boards and it becomes necessary to provide a mounting space on the lower surface of the lower board.

In either case, in order to realize the slidable portion as shown in FIG. 11, FIG. 12 that can be realized according to this embodiment by means of a general FPC, it is necessary to reduce the bending radius to a limit and a problem associated with the yield and reliability may occur. In the above embodiment, the mechanical operating portion performs a slide operation, but this embodiment can be applied to a more complicated movable portion such as a two-axis or three-axis hinge that cannot be coped with by the FPC or FFC.

Thus, the flexible wiring device of this embodiment has the feature that flexibility with extremely high degree of freedom can be attained, wiring of the mechanically movable portion that is difficult to be realized by means of a general FPC can be realized and the reliability can be made high.

(Modification)

This invention is not limited to the above embodiments. The size (length and width) and material of the flexible wiring board may be adequately determined according to the specification. Likewise, the relation between the end region, wiring region and bundled region may be adequately determined according to the specification. Further, the number of flexible wiring fins, that is, the number of slits formed in the wiring board is not limited and the effect of this invention can be expected even if it is set to one. Further, as bundling means, it is not limited to a bundling member, tape or guide and it is sufficient if it can bundle a plurality of flexible wiring fins to some extent. If the bundling portion is fixedly used as in the embodiment of FIG. 11, it may be fixed by use of an adhesive agent or an adhesive film may be inserted between wiring fins.

Further, it is preferable to form slits so that a plurality of flexible wiring fins will have substantially the same width, but it is not necessarily limited to this case and some difference may be tolerated. It is preferable to laminate flexible wiring fins with the front surface of one of two adjacent flexible wiring fins which sandwich a slit set in opposition to the back surface of the other wiring fin, but it is not necessarily limited to this case and a portion thereof may be reversed. Further, it is most desirable to set the electrical wiring patterns of a plurality of flexible wiring fins to the same pattern in the bundled region, but it is not necessarily limited to this case and it is sufficient if they are not greatly different.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A flexible wiring board comprising:
   a pair of end regions provided in portions of a flexible wiring board on which a plurality of wires are arranged in parallel in one direction and disposed separately in a wiring lengthwise direction, a wiring region configured in another portion of the wiring board and sandwiched between the end regions, a plurality of flexible wiring fins which is divided by at least one slit that connects the end regions in the wiring region, and a flexible wiring bundle bundling at least part of the plurality of flexible wiring fins, wherein the pair of end regions and the bundled region are arranged in a crank form and the plurality of flexible wiring fins are bundled to set a surface of the flexible wiring fin in the bundled region at an angle different from that of a surface of the end region.

2. The board of claim 1, wherein the slit is formed to set widths of the plurality of flexible wiring fins to substantially the same width.

3. The board of claim 1, wherein the wires of the plurality of flexible wiring fins are formed in substantially the same pattern in the bundled region.

4. The board of claim 1, wherein two adjacent ones of the plurality of flexible wiring fins which sandwich the slit are laminated in the bundled region with a front surface of one of the fins set in opposition to a back surface of the other fin.

5. The board of claim 1, wherein the flexible wiring fins are partly bundled by a binding band and the binding band is slidable in the wiring lengthwise direction.

6. The board of claim 1, wherein an optical wire extending in the wiring lengthwise direction is formed at least part of the flexible wiring fins.

7. The board of claim 6, wherein the optical wire is formed by embedding an optical wave-guide core in an optical wave-guide cladding layer attached to the wiring board, the optical wave-guide core having a refractive index higher than that of the optical wave-guide cladding layer.

8. The board of claim 1, wherein a different flexible wiring fin having width that is not larger than the width of the flexible wiring fin is arranged by the side of the flexible wiring fins and fixed on one main surface of the flexible wiring fins or the end regions at the slit, and an optical wire formed as the different flexible wiring fin.

9. A manufacturing method of a flexible wiring board comprising:

forming a plurality of flexible wiring fins by dividing a wiring region by forming at least one slit in a wiring lengthwise direction in the wiring region sandwiched between end regions at two ends in the wiring lengthwise direction of a flexible wiring board on which a plurality of wires are arranged in parallel in one direction, rotating the end regions in an in-plane direction to twist and attract the flexible wiring fins and superimpose the wiring fins with front and back surfaces of the adjacent wiring fins set in opposition to each other, and bundling the superimposed portion of the flexible wiring fins with a binding band.

10. A flexible wiring device comprising:

a first board comprising a first wire connection portion, a second board comprising a second wire connection portion, and a flexible wiring board connected between the first and second wire connection portions, wherein the flexible wiring board comprises a pair of end regions and a wiring region sandwiched between the end regions, the wiring region is divided into a plurality of flexible wiring fins by at least one slit that connects the end regions in the wiring region and a bundled region is formed by partly bundling the plurality of flexible wiring fins with one of a guide mechanism and bundling member provided on each board, and wherein the pair of end regions and the bundled region are arranged in a crank form and the plurality of flexible wiring fins are bundled to set a surface of the flexible wiring fin in the bundled region at an angle different from that of a surface of the end region.

11. The device of claim 10, wherein the slit is formed to set widths of the plurality of flexible wiring fins to substantially the same width.

12. The device of claim 10, wherein the wires of the plurality of flexible wiring fins are formed in substantially the same pattern in the bundled region.

13. The device of claim 10, wherein two adjacent ones of the plurality of flexible wiring fins which sandwich the slit are laminated in the bundled region with a front surface of one of the fins set in opposition to a back surface of the other fin.

14. The device of claim 10, wherein the flexible wiring fins are partly bundled by the binding band and the binding band is slidable in the wiring lengthwise direction.

15. The device of claim 10, wherein an optical wire extending in the wiring lengthwise direction is formed at least part of the flexible wiring fins.

16. The device of claim 15, wherein the optical wire is formed by embedding an optical wave-guide core in an optical wave-guide cladding layer attached to the wiring board, the optical wave-guide core having a refractive index higher than that of the optical wave-guide cladding layer.

17. The device of claim 10, wherein a different flexible wiring fin having width that is not larger than the width of the flexible wiring fin is arranged by the side of the flexible wiring fins and fixed on one main surface of the flexible wiring fins or the end regions at the slit, and an optical wire formed as the different flexible wiring fin.

18. The device of claim 10, wherein the first and second boards are laminated as upper and lower layers.

\* \* \* \* \*